United States Patent [19]
Fazan

[11] Patent Number: 5,478,772
[45] Date of Patent: Dec. 26, 1995

[54] METHOD FOR FORMING A STORAGE CELL CAPACITOR COMPATIBLE WITH HIGH DIELECTRIC CONSTANT MATERIALS

[75] Inventor: Pierre C. Fazan, Boise, Id.

[73] Assignee: Micron Technology, Inc., Boise, Id.

[21] Appl. No.: 390,336

[22] Filed: Feb. 17, 1995

Related U.S. Application Data

[63] Continuation of Ser. No. 44,331, Apr. 2, 1993, abandoned.
[51] Int. Cl.$^6$ ............ H01L 21/443; H01L 21/8242
[52] U.S. Cl. ............ 437/60; 437/52; 437/919; 148/DIG. 14
[58] Field of Search ............ 437/52, 60, 919; 148/DIG. 14

[56] References Cited

U.S. PATENT DOCUMENTS

| | | | |
|---|---|---|---|
| 4,903,110 | 2/1990 | Aono | 357/51 |
| 4,982,309 | 1/1991 | Shepherd | 361/321 |
| 5,053,351 | 10/1991 | Fazan et al. | 437/52 |
| 5,053,917 | 10/1991 | Miyasaka et al. | 361/321 |
| 5,099,305 | 3/1992 | Takenaka | 357/51 |
| 5,134,451 | 7/1992 | Katoh . | |
| 5,187,638 | 2/1993 | Sandhu et al. | 361/313 |
| 5,293,510 | 3/1994 | Takenaka | 257/295 |
| 5,335,138 | 8/1994 | Sandhu et al. | 361/303 |
| 5,401,680 | 3/1995 | Abt et al. | 437/52 |

OTHER PUBLICATIONS

"ULSI DRAM Technology with $Ba_{0.7}Sr_{0.3}TiO_3$ Film of 1.3 nm Equivelent $SiO_2$ Thickness and $10^{-9} A/cm^2$ Leakage Current" by E. Fujii et al. 1992 IEEE IEDM 92-267, pp. 32.1.1-32.1.4.

"A Stacked Capacitor with $(Ba_xSr_{1-x})TiO_3$ For 256 M DRAM" by Koyama et al. 1991 IEEE IEDM 91-823.

"Silicon Processing for the VLSI ERA" by Wolf, vol. 11–Process Integration, pp. 608–614, Jun. 1990.

Primary Examiner—Olik Chaudhuri
Assistant Examiner—Richard A. Booth
Attorney, Agent, or Firm—Susan B. Collier

[57] ABSTRACT

The invention is a storage cell capacitor having a storage node electrode comprising a barrier layer interposed between a conductive plug and an oxidation resistant layer. A thick insulative layer protects the sidewalls of the barrier layer during the deposition and anneal of a dielectric layer having a high dielectric constant. The method comprises forming the conductive plug in a thick layer of insulative material such as oxide or oxide/nitride. The conductive plug is recessed from a planarized top surface of the thick insulative layer. The barrier layer is formed in the recess. The process is then continued with a formation of an oxidation resistant conductive layer and the patterning thereof to complete the formation of the storage node electrode. Next a dielectric layer having a high dielectric constant is formed to overly the storage node electrode and a cell plate electrode is fabricated to overly the dielectric layer.

5 Claims, 16 Drawing Sheets

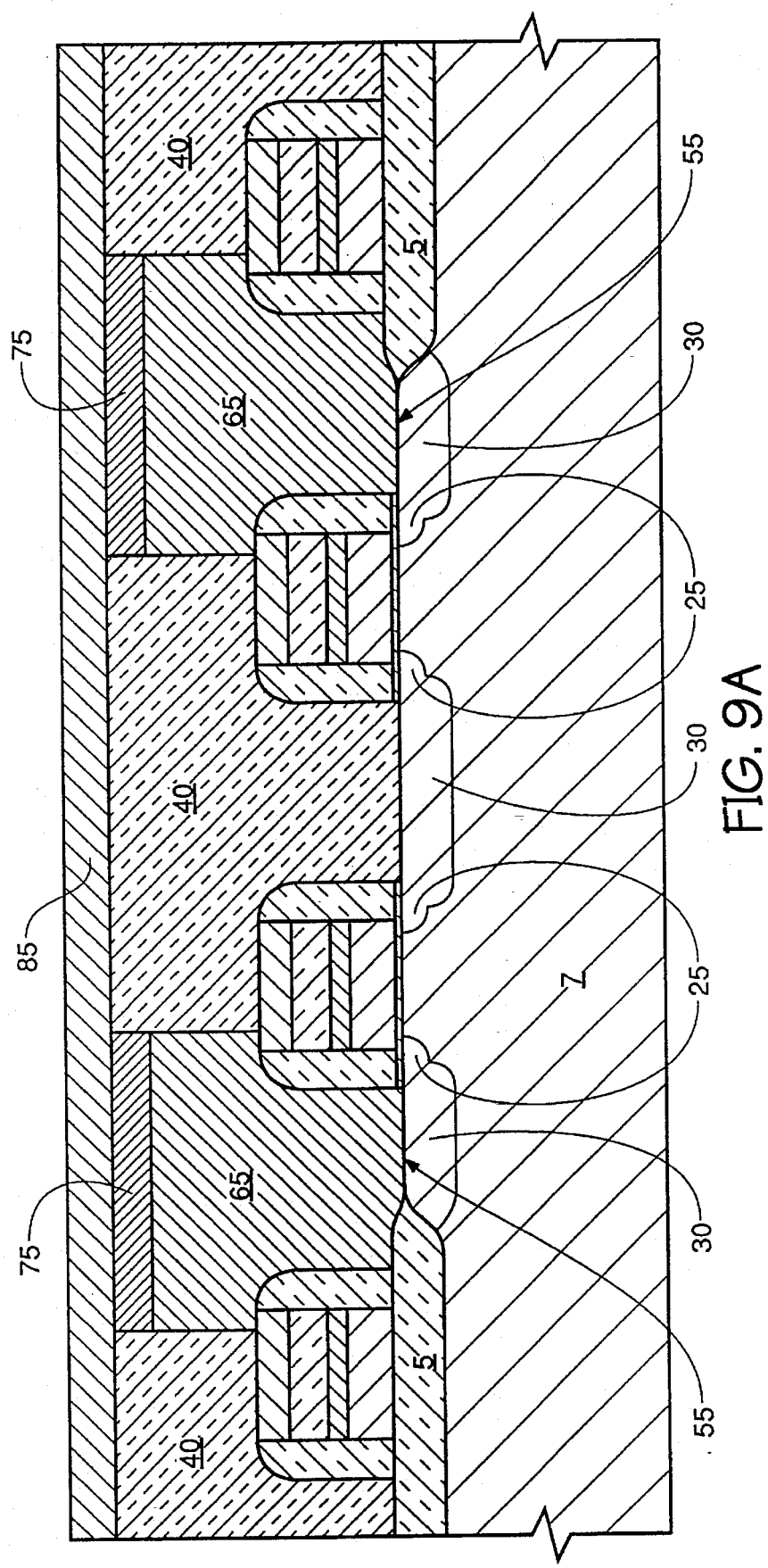

METHOD FOR FORMING A STORAGE CELL CAPACITOR COMPATIBLE WITH HIGH DIELECTRIC CONSTANT MATERIALS

This is a request for filing a: Continuation of application Ser. No. 08/044,331 filed on Apr. 2, 1993, now abandoned.

FIELD OF THE INVENTION

This invention pertains to semiconductor technology, and more particularly to storage cell capacitors for use in dynamic random access memories.

BACKGROUND OF THE INVENTION

As memory devices become more dense it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer to insulate the storage node electrode and cell plate electrode of the storage cell capacitor one from the other. A dielectric constant is a value characteristic of a material and is proportional to the amount of charge that can be stored in the material when it is interposed between two electrodes. $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$ are among some of the high dielectric constant materials that can be used in this application. These materials have dielectric constant values above 50 and will likely replace the standard $Si_3N_4$, $SiO_2/Si_3N_4$, $Si_3N_4/SiO_2$, or $SiO_2/Si_3N_4/SiO_2$ composite films used in 256 kilobits (Kb) to 64 megabits (Mb) generations of DRAMs. $Si_3N_4$ and $SiO_2/Si_3N_4$ composite films have dielectric constant values of 7 or less. The storage node and cell plate electrodes are also referred to as first and second electrodes.

Unfortunately BST is incompatible with existing processes and can not be simply deposited on a polysilicon electrode as was the case for the lower dielectric constant materials, such as $Si_3N_4$ and $SiO_2/Si_3N_4$ composite layers. In the storage cell capacitor incorporating BST, described in the IDEM-91 article entitled, A STACKED CAPACITOR WITH $(Ba_xSr_{1-x})TiO_3$ FOR 256M DRAM by Koyama et al., the storage node electrode typically comprises a layer of platinum overlying a tantalum layer which, in turn, overlies a polysilicon plug. Platinum is used as the upper portion of the first electrode since it will not oxidize during a BST deposition or subsequent anneal. An electrode that oxidizes would have a low dielectric constant film below the BST, thereby negating the advantages provided by the high dielectric constant material. The tantalum layer is introduced to avoid Si and Pt inter-diffusion and to prevent the formation of $SiO_2$ on top of the platinum surface. In addition, the platinum protects the top surface of the tantalum from strong oxidizing conditions during the BST deposition. FIG. 1 depicts the stacked storage node electrode comprising tantalum 1, platinum 2 (Ta/Pt) overlying the polysilicon plug 3.

However, the sidewalls 4 of the tantalum 1 formed during this process are subject to oxidation during the subsequent deposition of the BST layer. Since the tantalum 1 oxidizes the polysilicon plug 3 is also susceptible to oxidation. When portions of the polysilicon plug 3 and tantalum 1 are consumed by oxidation the capacitance of the storage cell capacitor is decreased since the storage node electrode is partially covered by a low dielectric constant film. Therefore the memory device cannot be made as dense. In addition, the storage node contact resistance increases drastically.

OBJECTS OF THE INVENTION

An object of the invention is to increase density of a memory device by increasing capacitance of storage cell capacitors. The storage cell capacitor of the invention features a storage node electrode having a barrier layer of tantalum or another material which experiences no oxidation during the formation of the storage cell capacitor. The barrier layer is interposed between a conductive plug and a non-oxidizing conductive material such as platinum. A dielectric layer, typically $Ba_xSr_{(1-x)}TiO_3$ [BST], is deposited on the non-oxidizing material. The barrier layer is surrounded on its sides by an insulative layer.

The insulative layer protects the barrier layer from oxidizing during the deposition and anneal of the BST thereby also eliminating oxidization of the conductive plug. By eliminating oxidation of the barrier layer and the conductive plug capacitance is maximized.

SUMMARY OF THE INVENTION

The invention is a storage node capacitor having a storage node electrode comprising a barrier layer interposed between a conductive plug and an oxidation resistant conductive layer and the method for fabricating the same. A thick insulative layer protects the sidewalls of the barrier layer during the deposition and anneal of a dielectric layer having a high dielectric constant.

The method comprises forming the conductive plug in a thick layer of insulative material such as oxide or oxide/nitride. The conductive plug is recessed from a planarized top surface of the thick insulative layer. The barrier layer is formed in the recess. The process is then continued with a formation of an oxidation resistant conductive layer and the patterning thereof to complete the formation of the storage node electrode.

Next a dielectric layer having a high dielectric constant is formed to overly the storage node electrode and a cell plate electrode is then fabricated to overly the dielectric layer.

Since the barrier layer is protected during the formation of the dielectric layer by both the oxidation resistant conductive layer and the thick insulative layer there is no oxidation of the barrier layer or the contact plug thereby maximizing capacitance of the storage node and reducing high contact resistance issues.

BRIEF DESCRIPTION OF THE DRAWINGS

FIGS. 2–11 are cross-sectional views of a portion of a partially processed semiconductor wafer depicting the steps of the invention for fabricating a storage cell capacitor.

FIG. 2 depicts field-effect transistors overlying a silicon substrate and wordlines overlying field oxide.

FIG. 3 is the wafer portion of FIG. 2 following the deposit of an undoped thick oxide layer and planarization thereof.

FIG. 4 is the wafer portion of FIG. 3 following the masking and subsequent etching of the deposited oxide layer to form self-aligned openings.

FIG. 5 is the wafer portion of FIG. 4 following the formation of polysilicon plugs in the openings and the removal of the mask shown in FIG. 4.

FIG. 6 is the wafer portion of FIG. 5 following the recessing of the polysilicon plug in the thick oxide layer.

FIGS. 9a and 9b are wafer portions of FIGS. 8a and 8b following the deposition of a platinum layer.

DETAILED DESCRIPTION OF THE PREFERRED EMBODIMENT

The method for fabricating the storage cell capacitor of the invention is shown pictorially in FIGS. 2–11.

Figure 1:
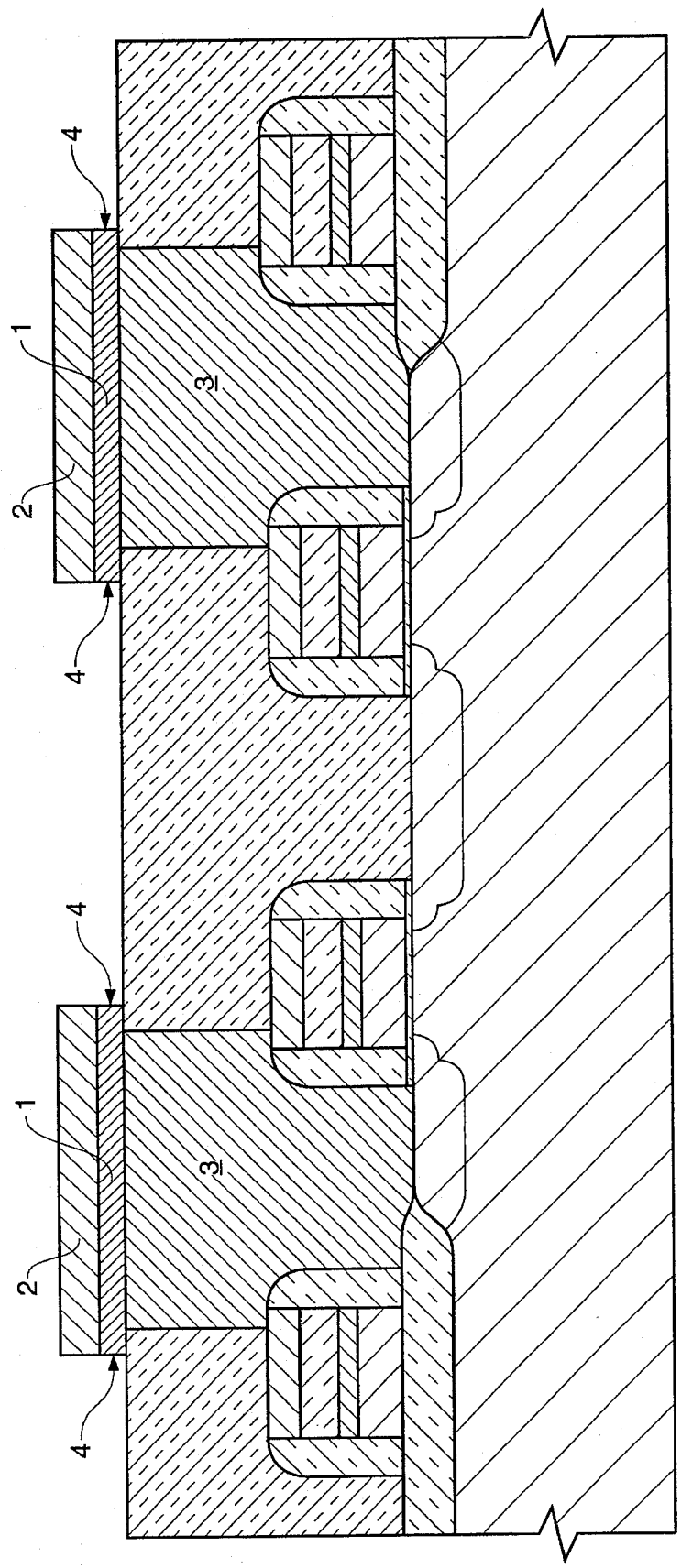
FIG. 1 is a cross-sectional view of a portion of a partially processed semiconductor wafer of the related art.
Figure 2:
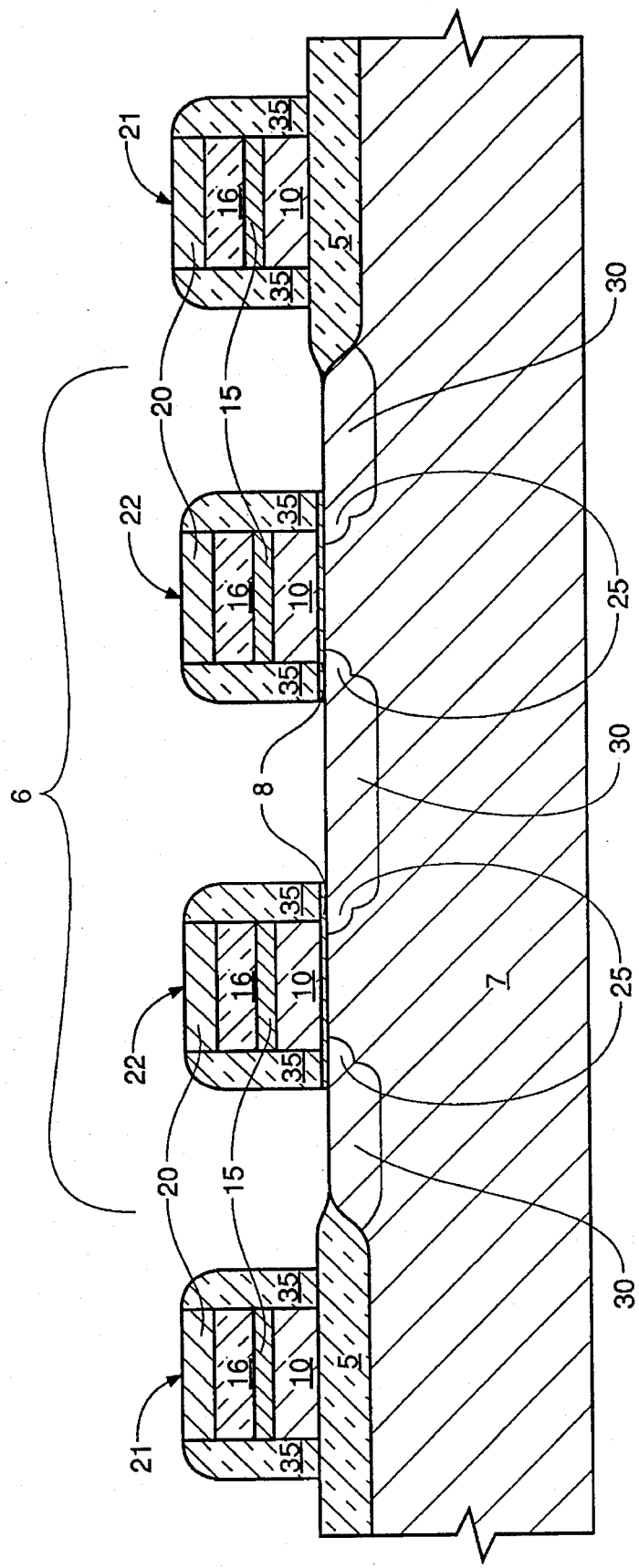

Referring to FIG. 2, a cross-sectional view of an in-process dynamic random access memory (DRAM) cell is shown following conventional local oxidation of silicon (LOCOS) or special LOCOS processing which creates substantially planar field oxide regions 5 (created using modified LOCOS or trench isolation processes) and future active areas 6 (those regions of the substrate not covered by field oxide) on a silicon substrate 7. The creation of the field oxide is preceded or followed by a thermally grown dielectric layer 8 of silicon oxide. The depicted cell is one of many cells that are fabricated simultaneously and comprise a memory array. Following the creation of the field oxide region 5 and dielectric layer 8 a first conductively doped polysilicon layer 10, a metal silicide layer (Wsi$_x$) 15, an oxide layer 16, and a thick nitride layer 20 are deposited. The thick nitride layer 20 will function as an etch stop during the storage node buried contact etch, thus allowing self-alignment if desired. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 8. The lightly-doped regions 25 are created utilizing a phosphorus or arsenic implant. Deposition, densification and a reactive ion etch (RIE) of a silicon nitride spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

The formation of the FETs 22 and wordlines 21 as described are exemplary of one application to be used in conjunction with the present embodiment of the invention. Other methods of fabrication and other applications are also feasible and perhaps equally viable.

Figure 3:
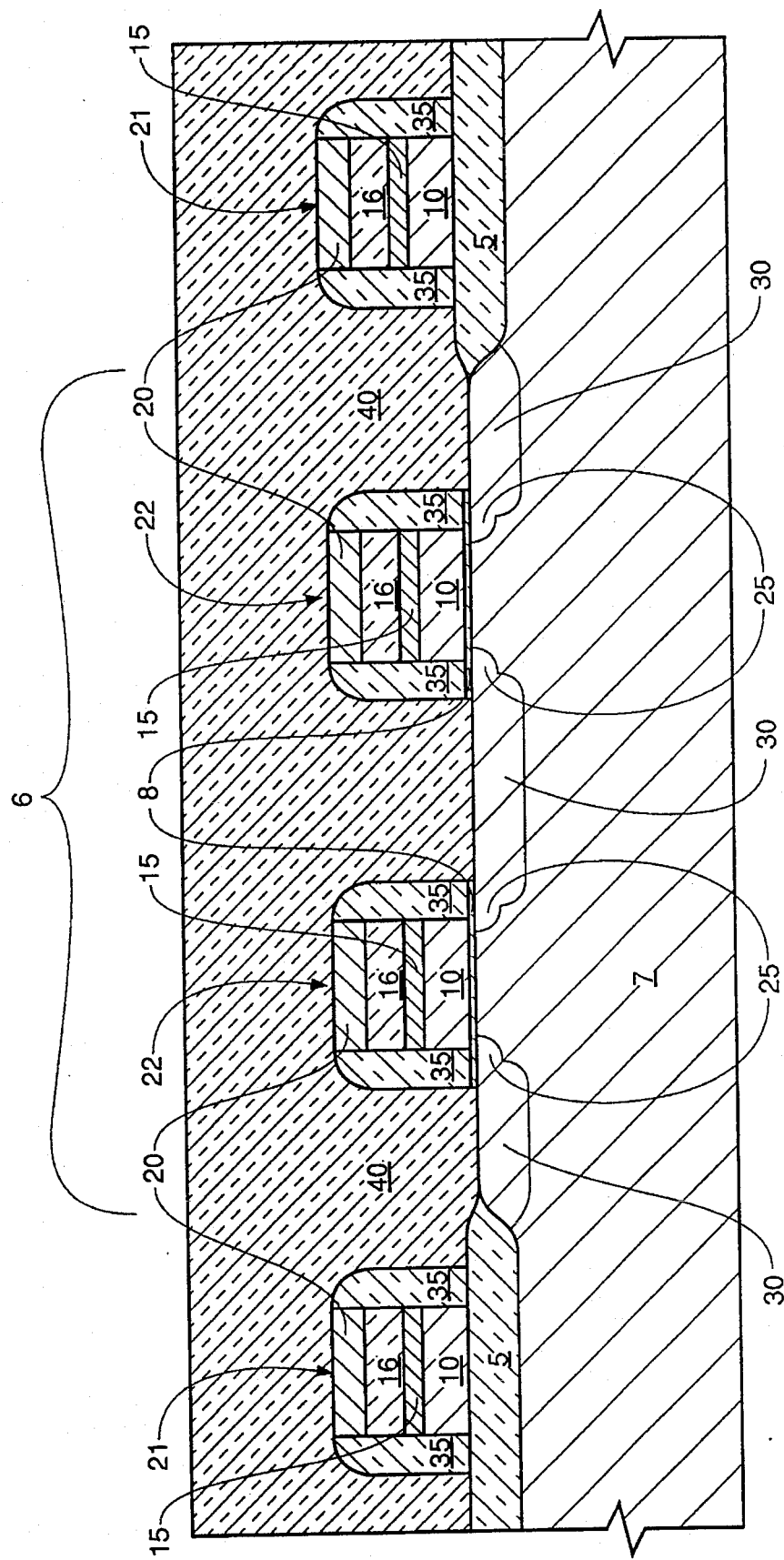

In FIG. 3 a thick insulative conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide is planarized, preferably chemical mechanically planarized (CMP), in order to provide a uniform height. Optionally nitride, oxynitride or another suitable material may be deposited as the insulative layer.

At this juncture buried digit lines may be fabricated as described in U.S. Pat. No. 5,168,073 herein incorporated by reference. In the case where the buried digit lines are formed by the method described in U.S. Pat. No. 5,168,073 the oxide 40 is deposited in two steps, one deposit prior to the digit line formation and one deposit subsequent to the digit line formation. In this case, an initial thick oxide layer is deposited and planarized and then overlaid with a relatively thick Si$_3$N$_4$ layer. The Si$_3$N$_4$ layer is then planarized. When the thick insulative layer is comprised only of oxide it is possible for oxygen to diffuse through the oxide. By overlying the oxide with Si$_3$N$_4$ it is possible to prohibit oxygen diffusion though the oxide.

Figure 4:
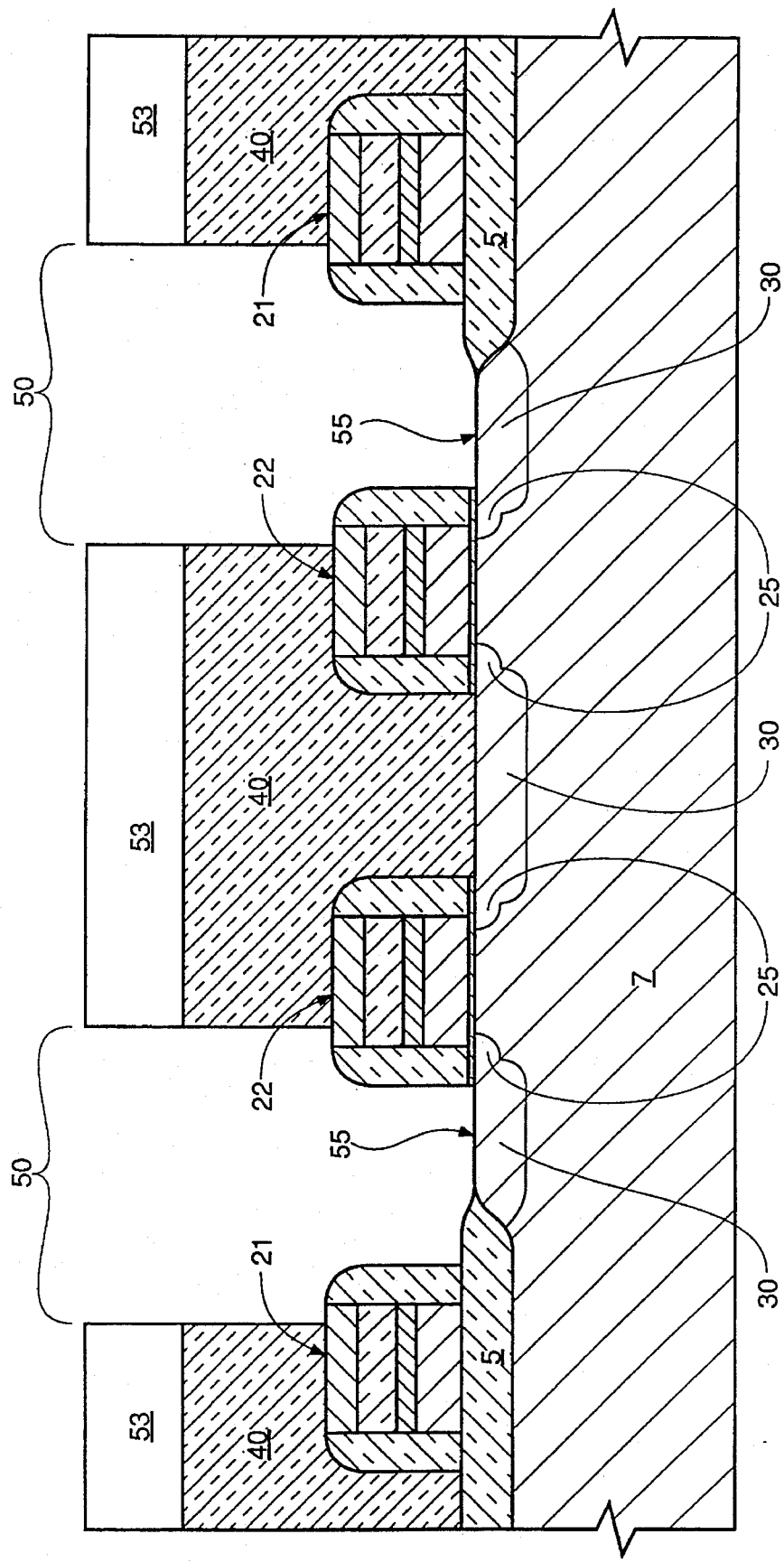

Referring to FIG. 4, mask 53 defines self-aligned substrate contact area 55. The oxide 40 is etched to form a self-aligned openings 50 exposing the contact areas 55 of the substrate 7.

Figure 5:
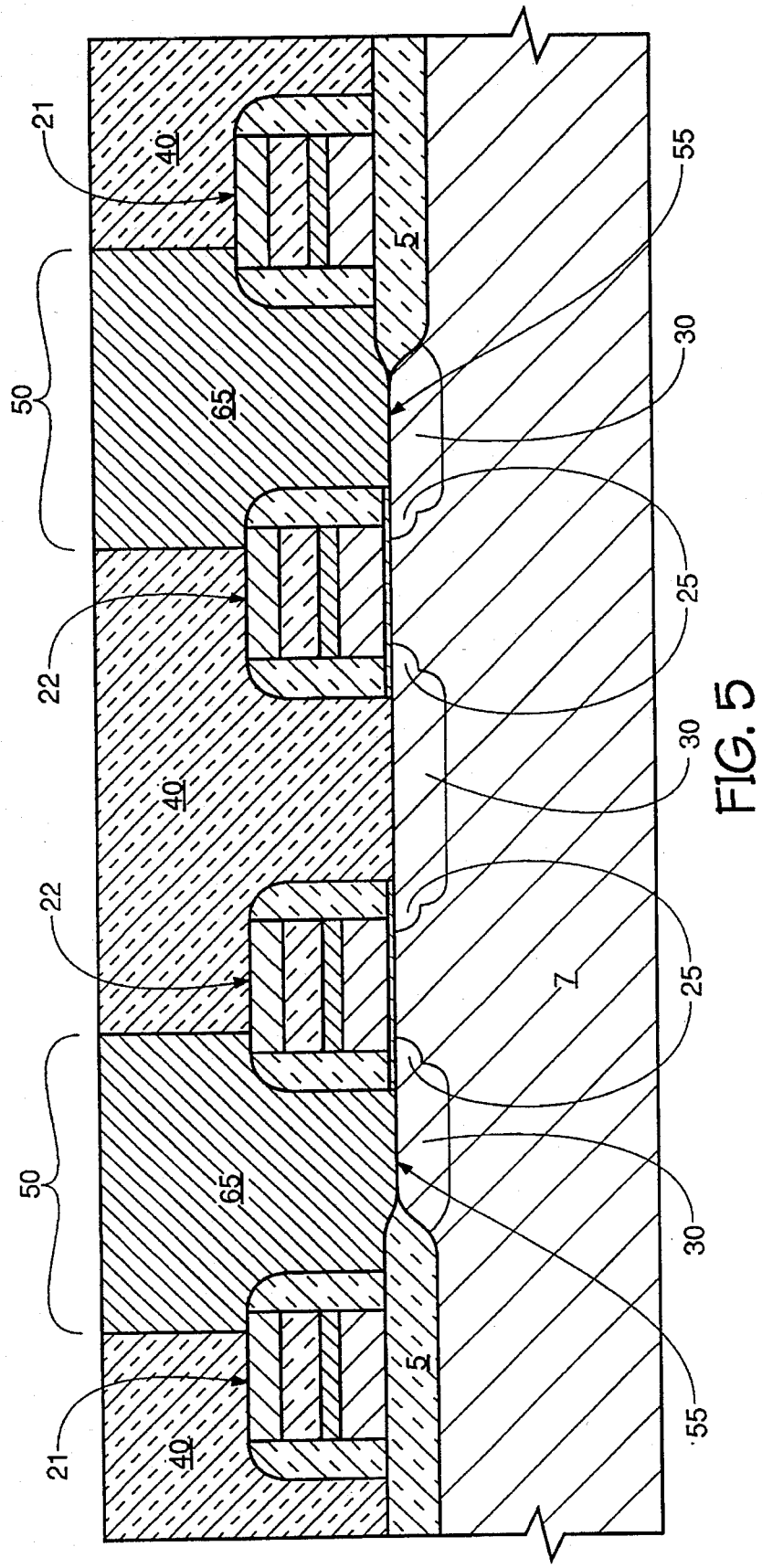

Referring to FIG. 5, in order to provide electrical communication between the substrate 7 and the storage cell capacitor a polysilicon plug 65 is formed in each opening 50. The actual method used to form the polysilicon plugs 65 is not critical, two options being a selective silicon growth from the contact area 55 or a doped polysilicon deposition and subsequent etch back or CMP back.

Figure 6:
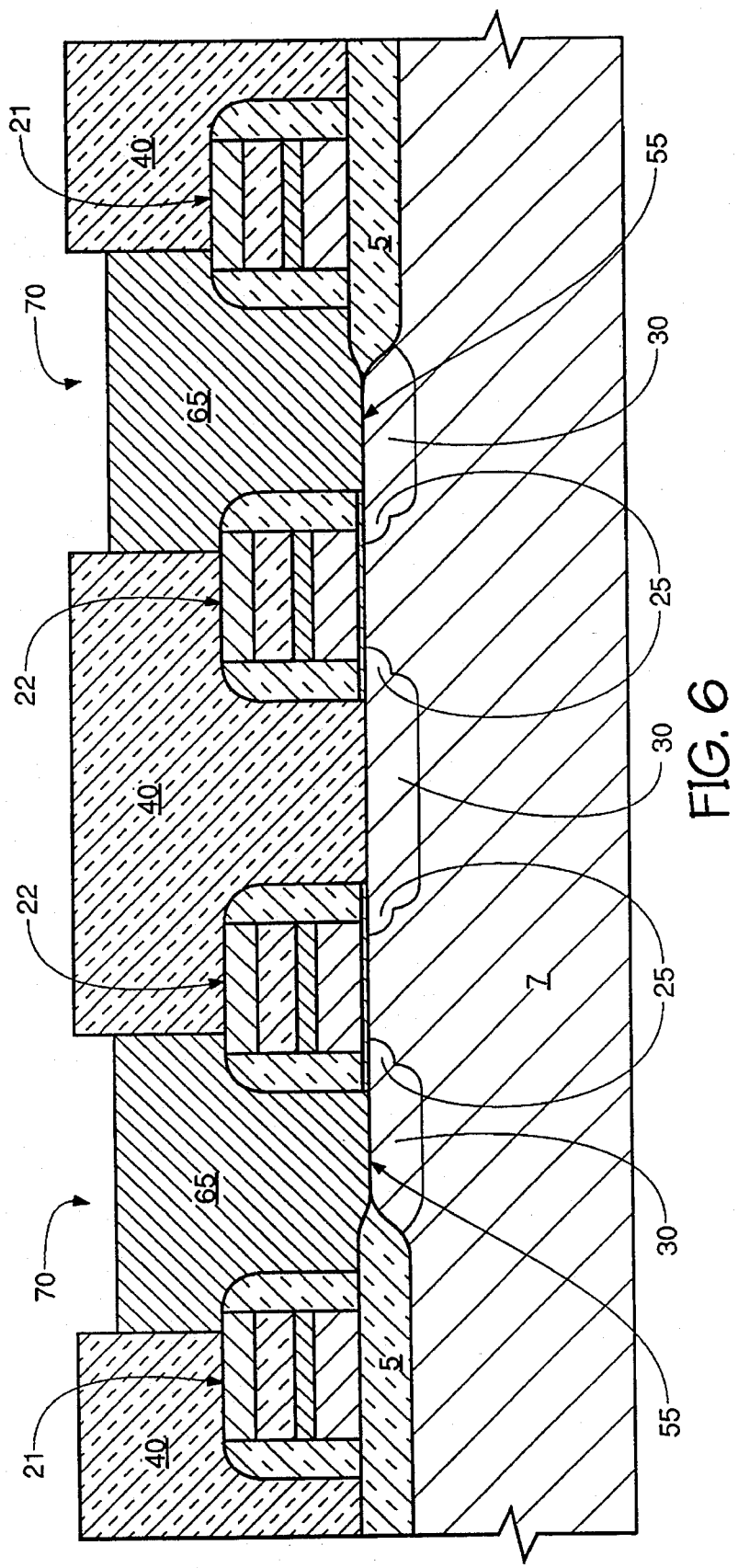

Referring now to FIG. 6, an upper portion of the polysilicon plugs 65 is removed during a dry etch in order to form a recesses 70, Typically, this etch back is 50 to 400 nano meters (nm). In a case where the polysilicon plugs 65 are formed during a selective silicon growth it is possible to form the recess 70 by controlling the growth.

Figure 7A:
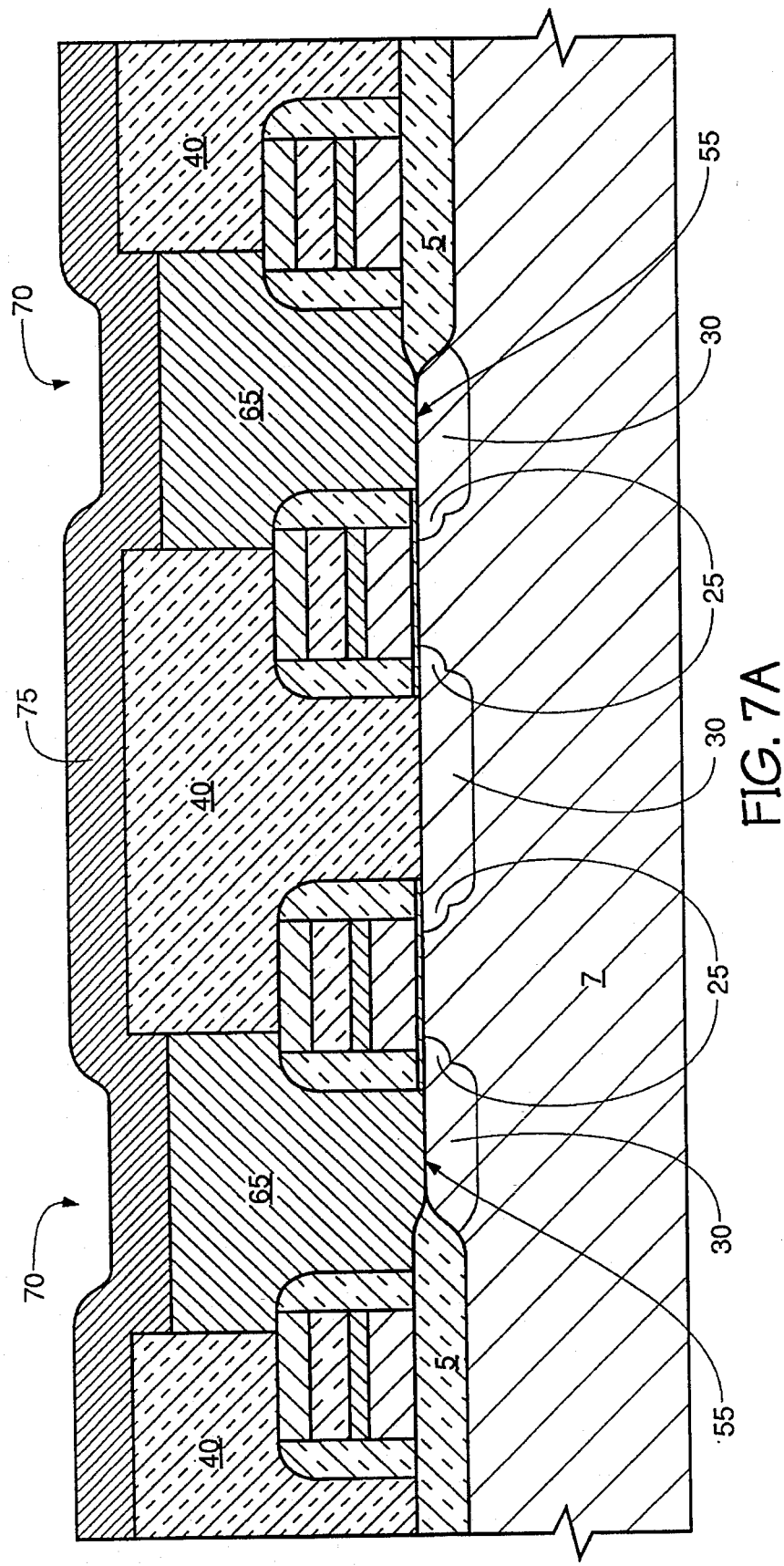
FIGS. 7a and 7b are wafer portions of FIG. 6 following the deposition of a tantalum layer.
Figure 7B:
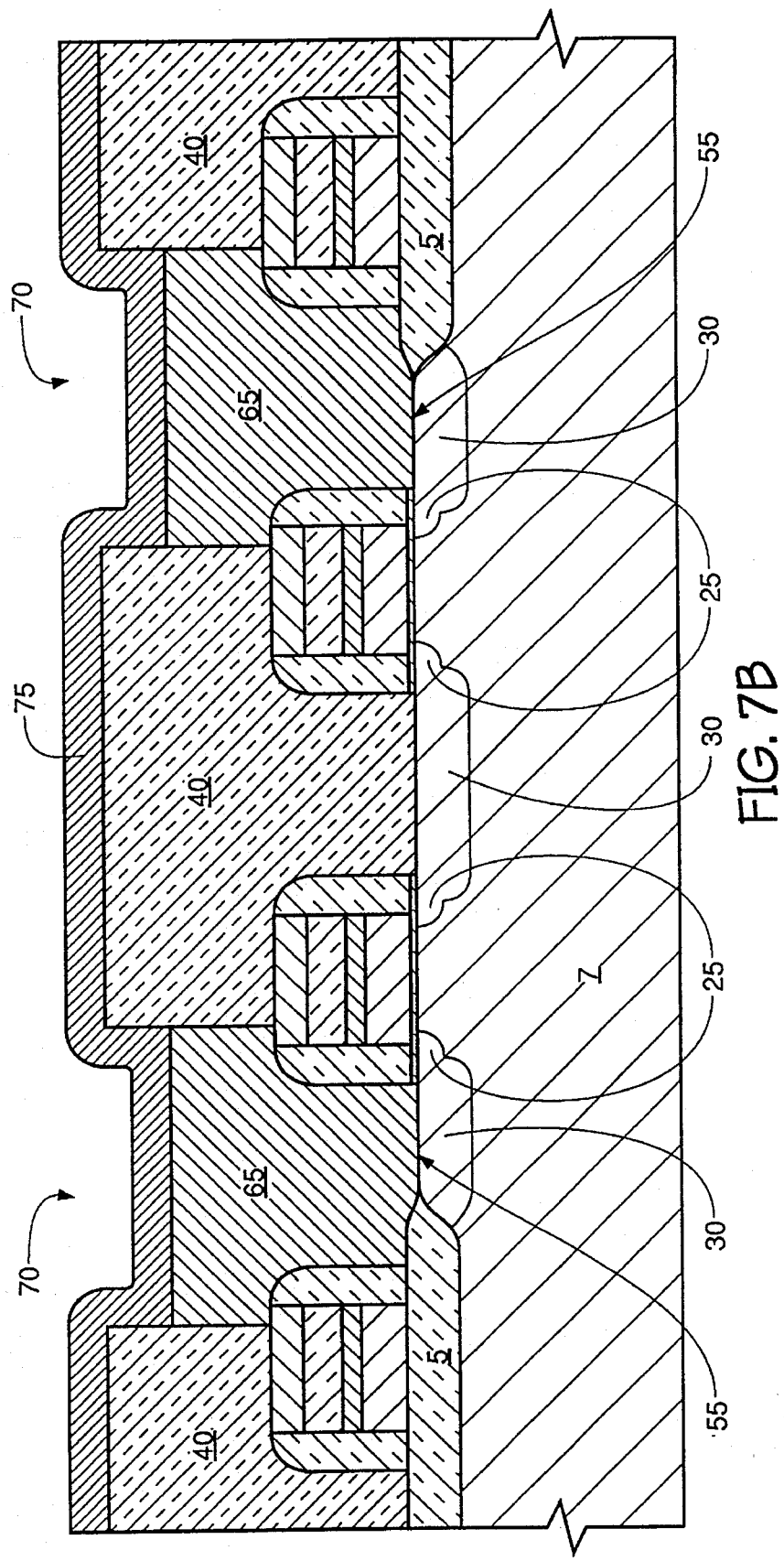

Referring to FIG. 7a, a tantalum layer 75, with a thickness larger than the depth of the recesses 70, is formed by a chemical vapor deposition (CVD) or a sputtering process performed at room temperature. The tantalum layer 75 provides a barrier against silicon diffusion of the polysilicon plug during subsequent high temperature anneals and other materials capable of prohibiting silicon diffusion may be used in place of tantalum. For example, titanium and titanium nitride may be used as well as other materials. Alternately, a tantalum layer 75 may be formed wherein the thickness is less than or equal to the depth of the recess. FIG. 7b depicts the latter case. In this particular case the storage cell capacitor gains more vertical area thereby increasing capacitance.

Figure 8A:
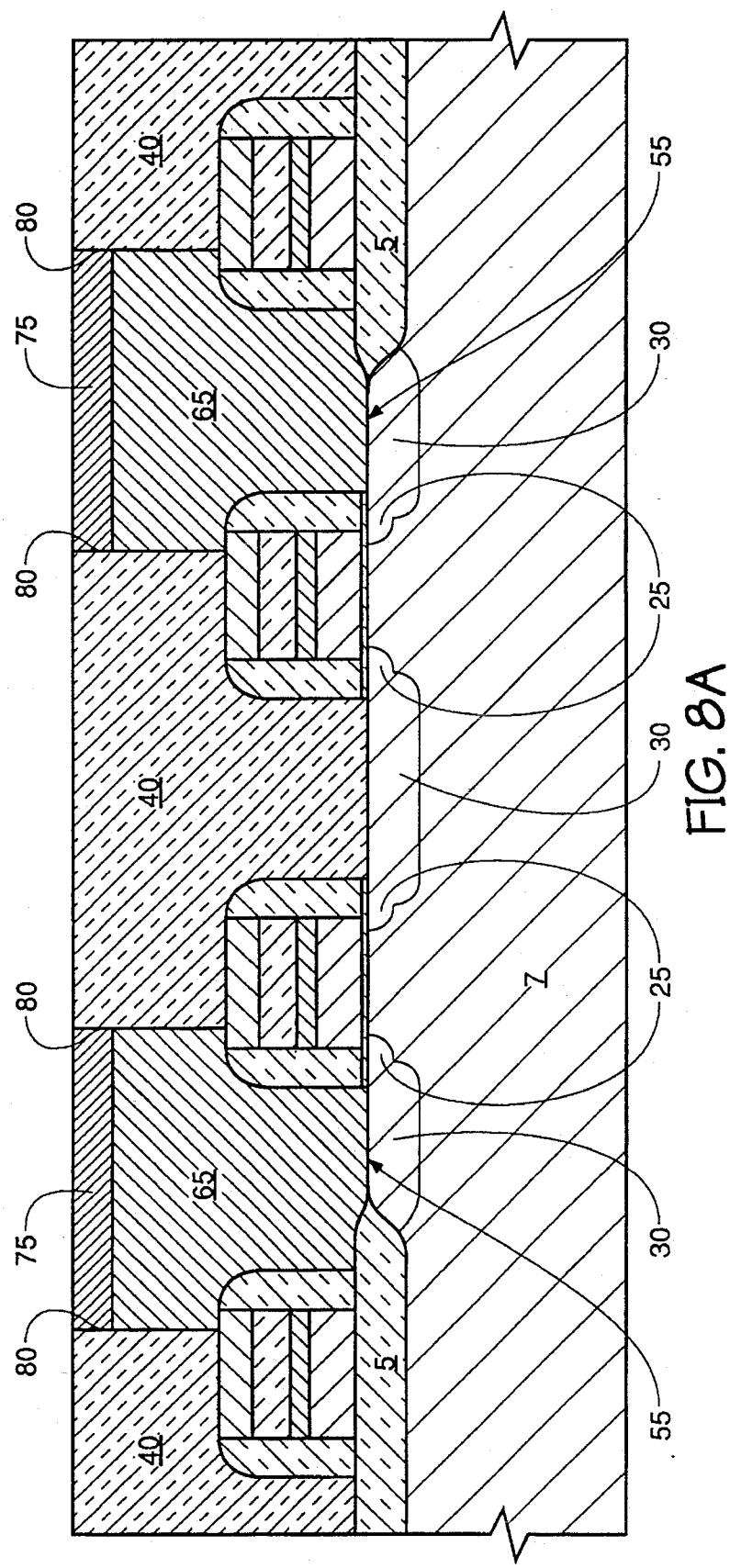
FIGS. 8a and 8b are wafer portions of FIGS. 7a and 7b following the planarization of the tantalum layer.
Figure 8B:
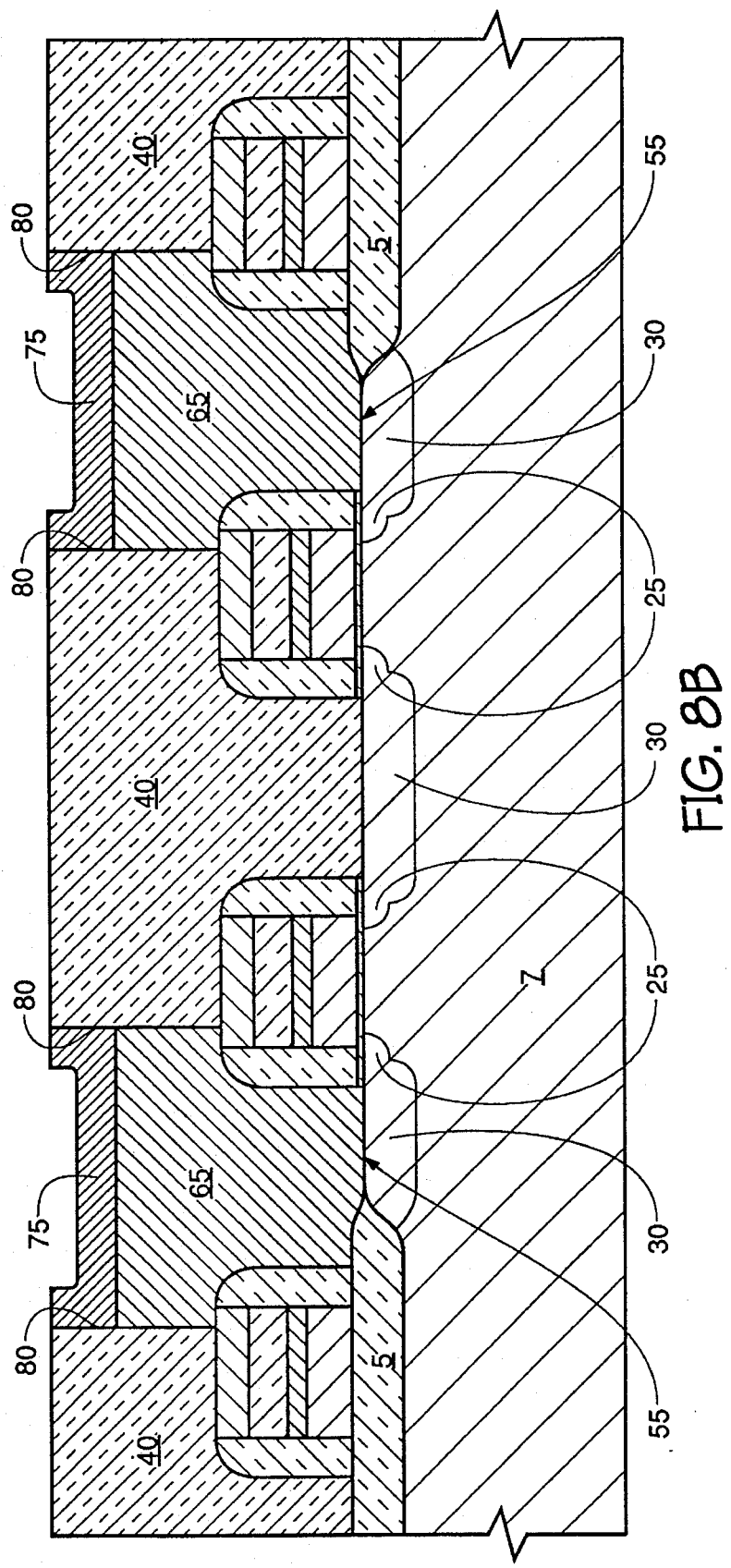

Referring to FIGS. 8a and 8b, the tantalum layer 75 of FIGS. 7a and 7b, respectively, is planarized, preferably by CMP, in order to expose at least the oxide layer 40 and in order to retain tantalum 75 in recesses 70 overlying the polysilicon plugs 65. Portions of the oxide layer 40 may be planarized during this step. It is important, of course to retain a sufficient depth of tantalum 75 in order to inhibit silicon diffusion of the polysilicon plugs 65. It can be seen that only the upper surface of the tantalum layer 75 is exposed and that the tantalum sidewalls 80 are protected by the oxide layer 40.

Figure 9B:
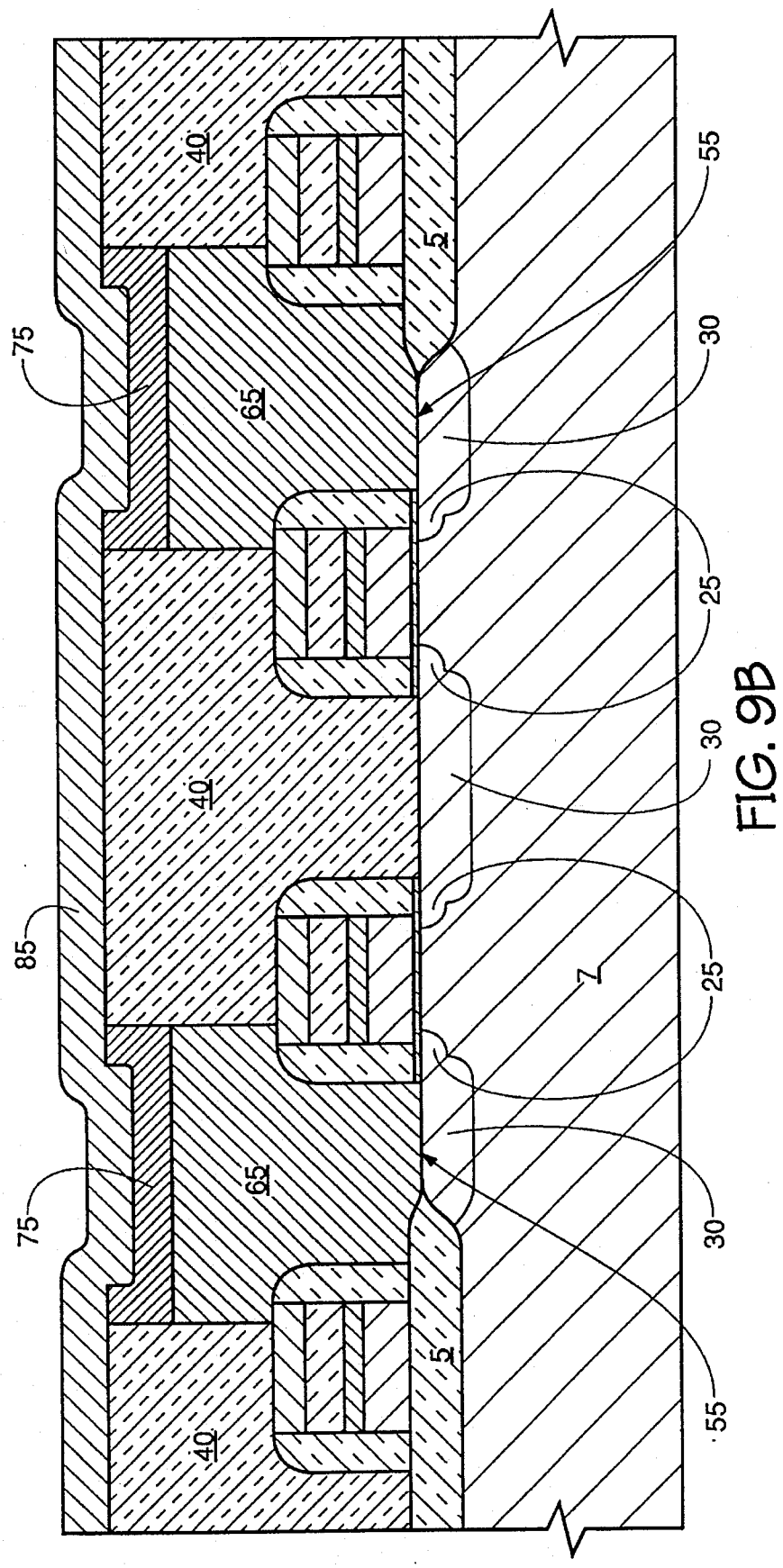

Referring to FIGS. 9a and 9b a platinum layer 85 is formed by CVD or a sputtering technique. The platinum layer 85 overlies the tantalum layer 75 shown in FIGS. 8a and 8b, respectively. Since the platinum layer 85 is resistant to oxidation it provides an excellent surface for the deposition of the high dielectric constant material. Other materials which are resistant to oxidation may be used in place of the platinum. For example, RuO$_2$ and as well as other non-oxidizing materials may be used. Since the tantalum layer is recessed below the oxide layer 40, a thick layer of platinum may be deposited without decreasing the density of the device. By using very thick platinum electrodes, the capacitance area is increased by the sidewall area contribution. Therefore, the platinum is deposited from at least a thickness of 50 nm to a thickness of 1 micro meter(μm).

Figure 10A:
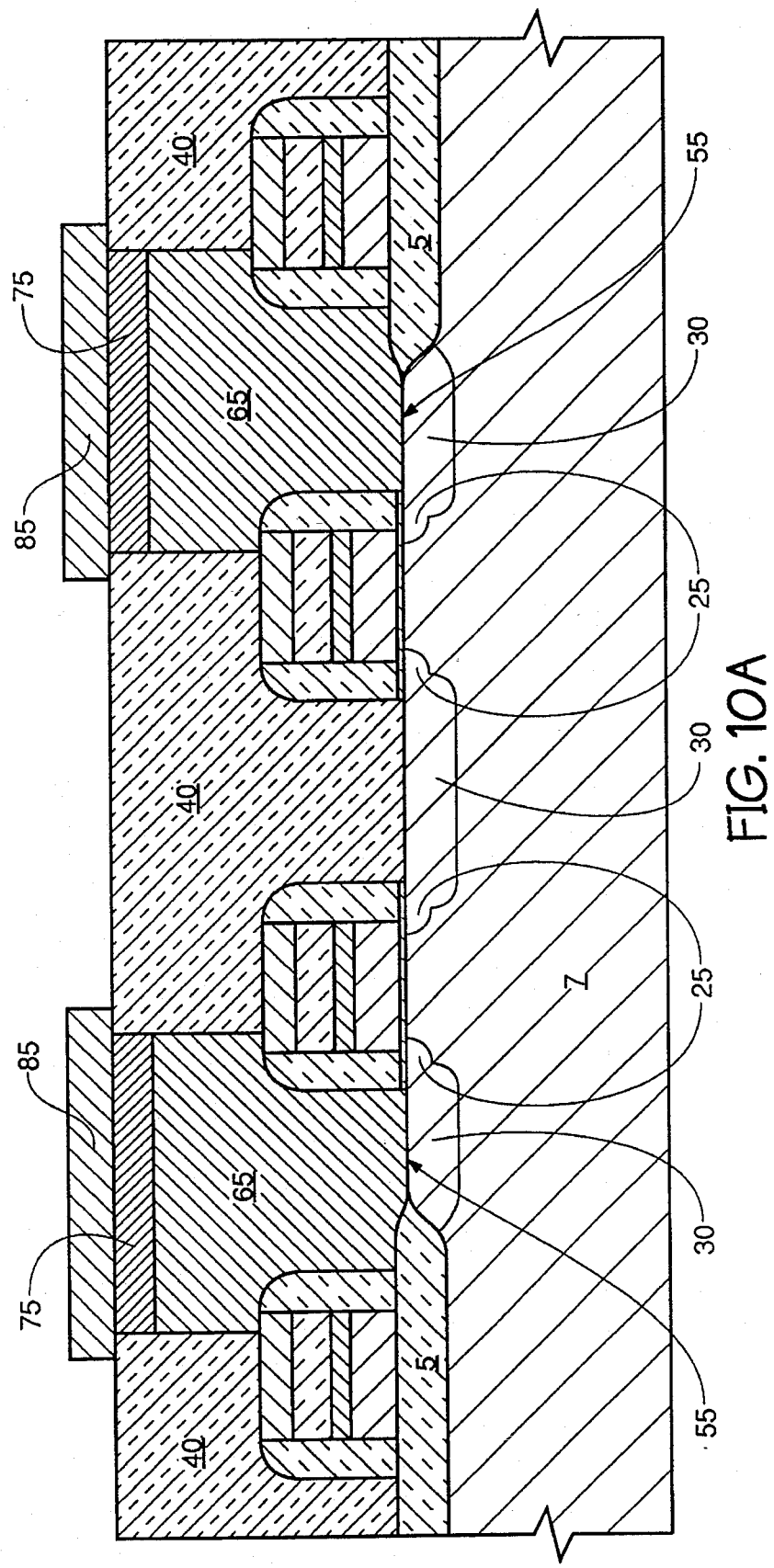
FIGS. 10a and 10b are the wafer portions of FIGS. 9a and 9b following the etching of the platinum layer to complete the formation of the storage node.
Figure 10B:
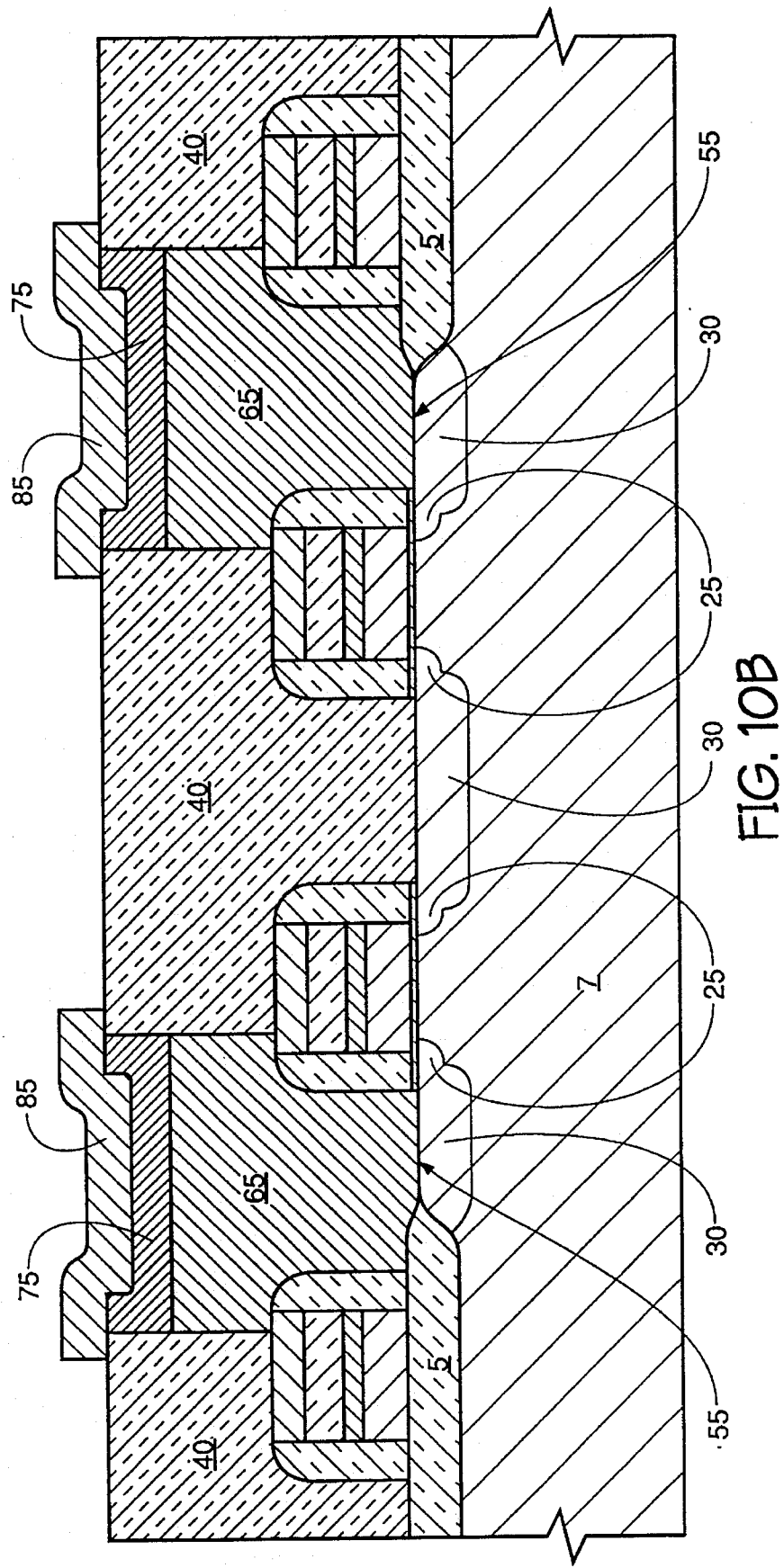

FIGS. 10a and 10b depict the structure following the masking of the platinum layer 85 overlying the tantalum and the removal of unmasked portions of the platinum layer 85 to form the completed storage node electrode of the storage cell capacitor. Typically the storage node electrode is thought of as comprising the tantalum layer 75 and the platinum layer 85. The polysilicon plug 65 is often thought of as an electrical interconnect interposed between the substrate and the storage node electrode, although it can be thought of as a portion of the storage node itself.

Figure 11A:
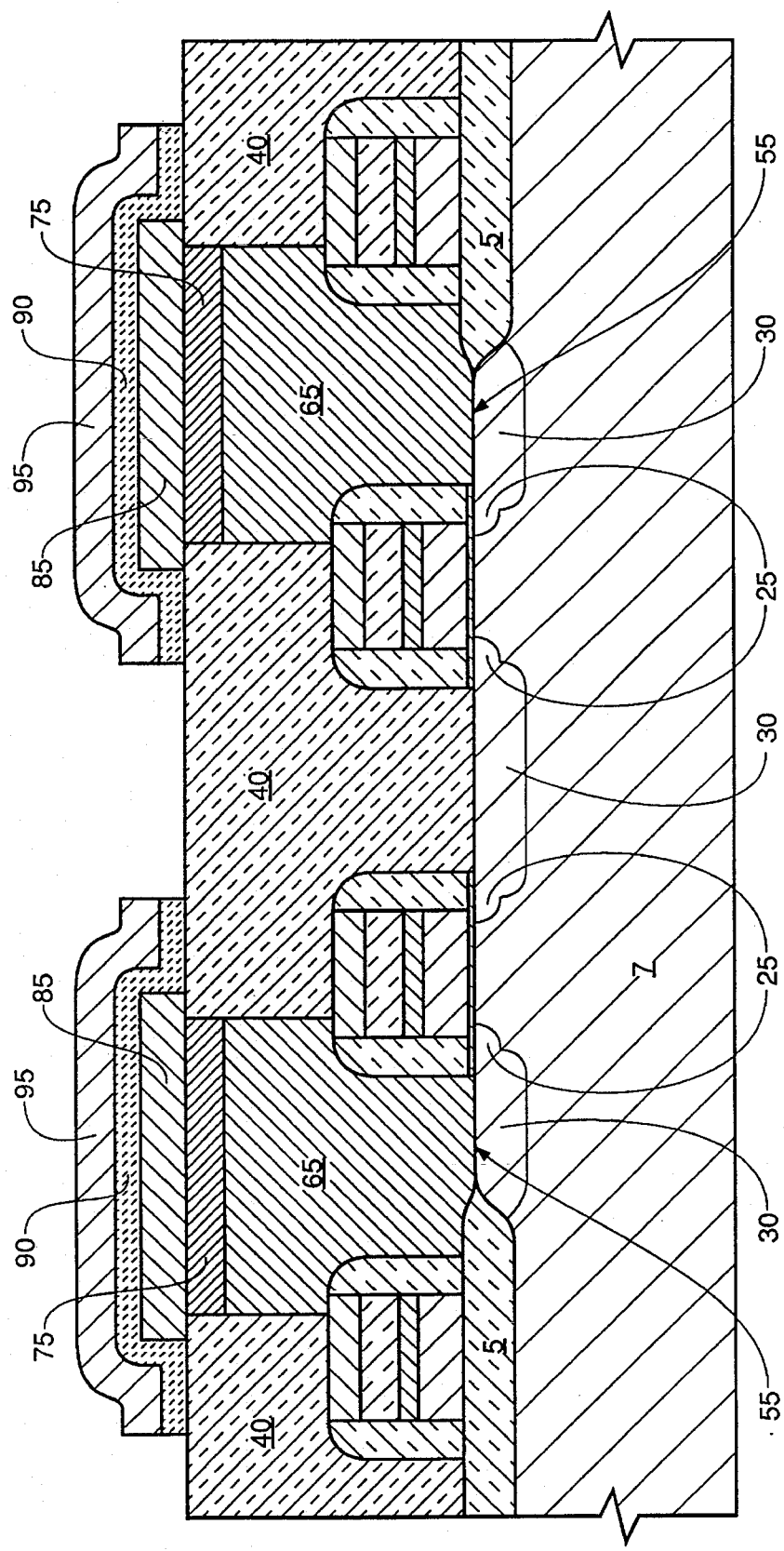
FIGS. 11a and 11b are wafer portions of FIGS. 10a and 10b following the deposition of a BST dielectric layer and a cell plate layer and patterning of these layers to complete the formation of the storage cell capacitor.
Figure 11B:
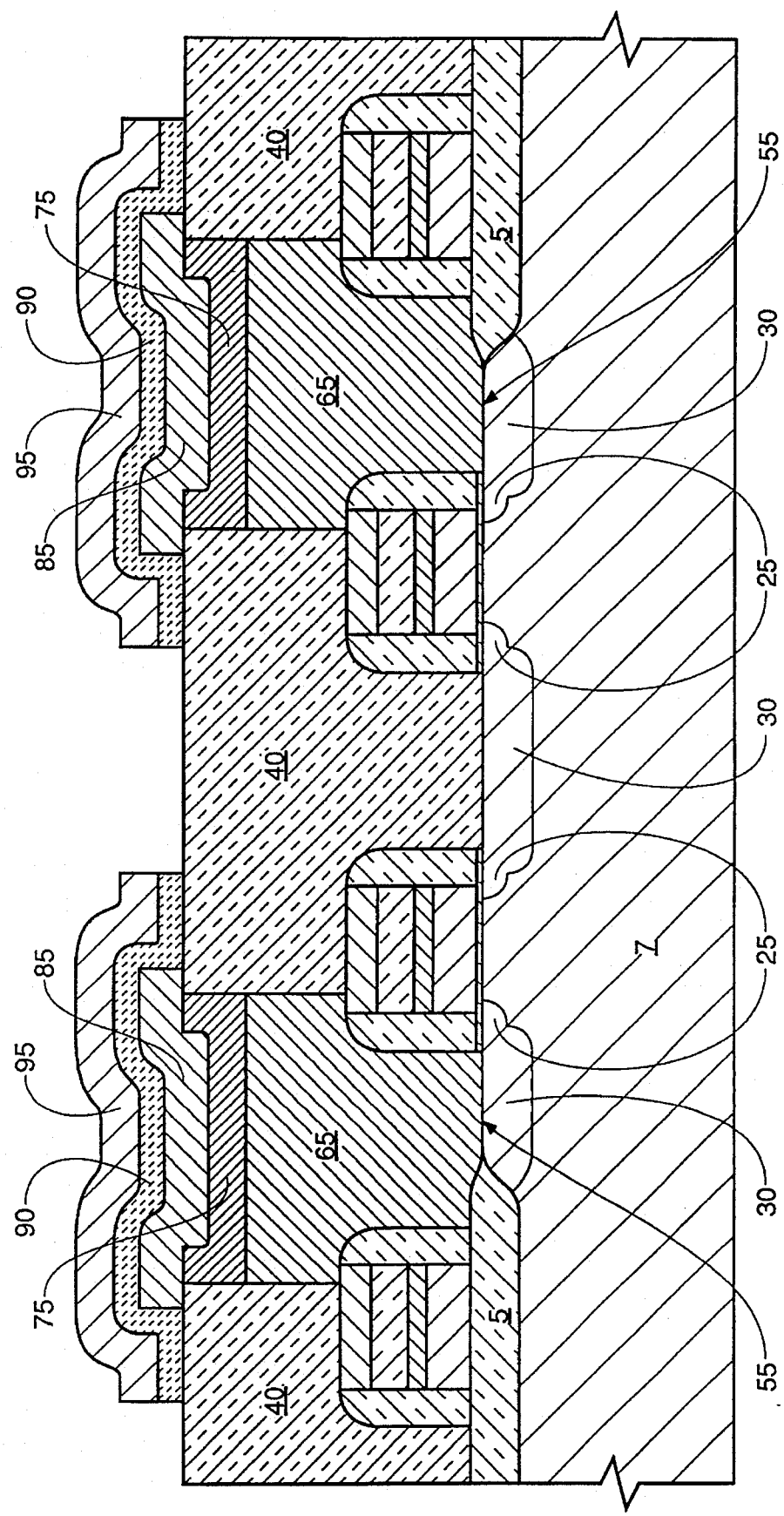

FIGS. 11a and 11b depict the storage cell capacitor following a deposition and anneal of a dielectric layer 90 overlying the platinum layer 85 of FIGS. 10a and 10b, respectively. The dielectric layer is typified as having a high dielectric constant. The storage cell capacitor fabrication is completed with the sputter or CVD of a 50 to 200 nm thick cell plate layer 95 to form a cell plate electrode. The cell plate layer 95 is typically Platinum, TiN or some other conductive material.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In the applicant's invention BST is the preferred material and is deposited at a thickness range of 30 nm–300 nm by RF-magnetron sputtering or CVD. The tantalum layer 75 is not oxidized during the application of a high temperature anneal due to the fact that it is protected on its sidewalls 80 by the oxide layer 40 and that it is protected on its upper surface by the platinum layer 85, see FIG. 11. Therefore even after the formation of the dielectric layer the recess retains the original tantalum 75 formed therein and capacitance is not sacrificed as it would be when portions of the tantalum 75 are consumed by oxidation. Therefore capacitance is effectively increased over methods where portions of tantalum are oxidized.

The process can be continued or modified to accommodate the steps described in U.S. Pat. No. 5,168,073, previously incorporated by reference, for providing electrical interconnection between a plurality of capacitors thus formed.

By utilizing the method of the preferred embodiments of the invention, a high density memory device is provided featuring a stacked capacitor formed in a compact area as a result of a dielectric layer having a high dielectric constant and retention of storage node integrity during an anneal of the dielectric layer and the capability of depositing a very thick platinum layer as a portion of the first electrode.

Although a process and an alternate process have been described for forming the storage cell capacitor it is apparent the process is equally applicable for the fabrication of other types of capacitors used in integrated circuits. It should also be apparent to one skilled in the art that changes and modifications, such as deposition depths, may be made thereto without departing from the spirit and scope of the invention as claimed.

What is claimed is:

1. A method for fabricating a capacitor, comprising the following steps:

a) forming an electrically insulative layer overlying a substrate;

b) forming an opening in said insulative layer in order to expose said substrate;

c) forming a conductive silicon plug in said opening, said conductive silicon plug forming a first portion of a first electrode of said capacitor;

d) providing a recess in said opening between a surface of said insulative layer and a surface of said conductive silicon plug;

e) forming a tantalum barrier layer, for preventing diffusion, in said recess such that said tantalum barrier layer is surrounded on sidewalls by said insulative layer, said tantalum barrier layer overlying said conductive silicon plug and forming a second portion of said first electrode;

f) forming a platinum layer overlying said tantalum barrier layer and overlying a portion of said insulative layer to form a third portion of said first electrode;

g) forming a dielectric layer overlying said platinum layer; and h) forming a second electrode overlying said dielectric layer, said dielectric layer electrically insulating said first and said second electrodes from one another.

2. A method for fabricating a capacitor for an integrated circuit, comprising the following steps:

a) forming a contact plug overlying and in electrical contact with a substrate;

b) interposing a diffusion barrier layer between said contact plug and a conductive oxidation resistant layer, said contact plug, said diffusion barrier layer, and said conductive oxidation resistant layer forming a first electrode of said capacitor, said diffusion barrier layer inhibiting diffusion between said contact plug and said conductive oxidation resistant layer; and c) encompassing sidewalls of said diffusion barrier layer with an electrically insulative layer, said insulative layer prohibited from overlying and underlying said diffusion barrier layer, wherein said conductive oxidation resistant layer overlies a portion of said insulative layer.

3. A method for fabricating a capacitor, comprising the following steps:

a) depositing an electrically insulative layer overlying a substrate;

b) forming an opening in said insulative layer in order to expose said substrate;

c) forming a conductive plug in said opening, said conductive plug forming a first portion of a first electrode of said capacitor;

d) providing a recess in said opening between a surface of said insulative layer and a surface of said conductive plug;

e) forming a diffusion barrier layer in said recess such that said diffusion barrier layer is surrounded on sidewalls by said insulative layer, said diffusion barrier layer overlying said conductive plug and forming a second portion of said first electrode;

f) forming a conductive oxidation resistant layer overlying said diffusion barrier layer and overlying a portion of said insulative layer to form a third portion of said first electrode, said diffusion barrier layer inhibiting diffusion between said conductive plug and said conductive oxidation resistant layer;

g) forming a dielectric layer overlying said oxidation resistant layer; and h) forming a second electrode overlying said dielectric layer, said dielectric layer electrically insulating said first and said second electrodes from one another.

4. A method for fabricating a capacitor for an integrated circuit, comprising the following steps:

a) depositing an electrically insulative layer overlying a substrate;

b) masking the insulative layer to define a future opening in the insulative layer;

c) etching the insulative layer in an unmasked region to form the opening and to expose the substrate in the unmasked region;

d) forming silicon in the opening;

e) creating a recess in the opening, the recess recessed from a surface of the insulative layer;

f) depositing a diffusion barrier layer overlying the insulative layer and the silicon;

g) removing portions of the diffusion barrier layer overlying the insulative layer;

h) forming a conductive oxidation resistant layer to overly the diffusion barrier layer and the insulative layer;

i) masking the conductive oxidation resistant layer to create a masked portion of the conductive oxidation resistant layer, the masked portion overlying the diffusion barrier layer and the insulative layer; and j) removing exposed portions of the noble metal layer while retaining the masked portion of the noble metal layer, the noble metal layer, the diffusion barrier layer and the silicon forming an electrode of the capacitor.

5. The method as specified in claim 4, wherein the electrode is a first electrode and further comprising the following steps:

a) creating a dielectric layer overlying the first electrode; and b) creating a second electrode overlying the dielectric layer.

* * * * *